United States Patent

Yang

(10) Patent No.: US 8,755,231 B2
(45) Date of Patent: Jun. 17, 2014

(54) FLASH MEMORY

(75) Inventor: Guangjun Yang, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 49 days.

(21) Appl. No.: 13/601,858

(22) Filed: Aug. 31, 2012

(65) Prior Publication Data

US 2013/0235670 A1    Sep. 12, 2013

(30) Foreign Application Priority Data

Sep. 1, 2011    (CN) .......................... 2011 1 0257705

(51) Int. Cl.
*G11C 11/34* (2006.01)
(52) U.S. Cl.
USPC ................................ 365/185.18; 365/185.24
(58) Field of Classification Search
USPC ....................................... 365/185.18, 185.24
See application file for complete search history.

(56) References Cited

U.S. PATENT DOCUMENTS 6,813,696 B2 * 11/2004 Kanda et al. ................... 711/167
8,495,401 B2 *  7/2013 Hwang .......................... 713/320

* cited by examiner

*Primary Examiner* — Michael Tran
(74) *Attorney, Agent, or Firm* — Muncy, Geissler, Olds & Lowe, P.C.

(57) ABSTRACT

A flash memory is disclosed. The flash memory includes a flash memory chip; a serial-to-parallel converter for receiving and converting a serial data to a parallel data; and a data mode decision circuit connected to an output terminal of the serial-to-parallel converter for generating an inversion control signal through the parallel data and for applying an inversion processing to the parallel data and then outputting an inverted parallel data to the flash memory chip under the control of the inversion control signal. By converting the serial data to a parallel data and then writing the parallel data into the flash memory chip, a lower proportion of the inversion control signal to the total amount of data is achieved, and therefore less area is consumed while the same programming efficiency and average programming power is maintained compared with a flash memory adopting the bit inversion technique of the prior art.

2 Claims, 1 Drawing Sheet

FLASH MEMORY

CROSS-REFERENCES TO RELATED APPLICATIONS

This application claims priority to Chinese patent application number 201110257705.8, filed on Sep. 1, 2011, the entire contents of which are incorporated herein by reference.

TECHNICAL FIELD

The present invention relates to a flash memory, and more particularly, relates to a flash memory for high-efficiency programming.

BACKGROUND OF THE INVENTION

Because of its advantages of convenience for use, high memory density, good reliability and others, flash memory has become the research focus of non-volatile memories. Since their debut in 1980s, accompanied with the development of technology and increasing needs of various electronic products for memory devices, flash memories have been widely used in mobile phones, laptop computers, personal digital assistants (PDA), USB flash disks and other portable communication devices. As a kind of non-volatile memory, a flash memory stores data by changing threshold voltages of the transistors or memory cells to control the gate electrode channels to be switched on or off, such that the data stored in the memory will not be lost due to power outage. Flash memory is a kind of electrically erasable programmable read-only memory (EEPROM) with a special structure. Currently, flash memories have taken a major market share of non-volatile semiconductor memories, and have become the fastest growing sector of the market.

Inside a flash memory programmed with hot carriers, a charge pump which generates a high voltage (6-10V) always occupies a large area since it needs to drive a large current loading. The more the data bits of a flash memory are to be programmed at one time, the stronger drive ability of the charge pump is needed, and the more area is needed. Generally speaking, the most common practice to reduce the size and cost of an embedded design is to use a communication bus with a smaller number of input/output pins. Therefore, the serial input/output method is adopted in most existing flash memories. FIG. 1 illustrates an existing flash memory using a serial input method, in which a data DIN<m:0> is written into a flash memory chip in a serial mode. Although the serial input/output method enables an obvious reduction of size and cost of the device, it will also result in a limited communication speed and therefore a low efficiency in data communication. Bit inversion technique is another way to reduce the size and cost by reducing the current loading of the charge pump. This method is to make the number of data bits to be programmed less than or equal to half of the total data bits. However, when this bit inversion technique is further adopted in the serial input/output method, the inversion control signals will account for a great proportion of the total amount of data bits, thus leading to a significant area consumption.

In conclusion, due to the adoption of the serial input/output method, flash memories of the prior art have encountered the problem of limited data communication speed which further leads to a low efficiency in data communication and significant area consumption. Thus, there is a need for improved techniques to solve this problem.

SUMMARY OF THE INVENTION

In order to overcome the defects of the prior art, the main objective of the present invention is to provide a flash memory with an improved speed for data communication and hence an improved programming efficiency achieved by converting serial data into parallel input data and applying an inversion processing to the parallel input data and then writing the parallel data by the inversion processing being done with to a flash memory chip.

To achieve the above objective, the present invention provides a flash memory, which includes: a flash memory chip; a serial-to-parallel converter for receiving a serial data and converting the serial data into a parallel data; and a data mode decision circuit connected to an output terminal of the serial-to-parallel converter for receiving the parallel data and generating an inversion control signal, the data mode decision circuit applying an inversion processing to the parallel data and then outputting an inverted parallel data to the flash memory chip under control of the inversion control signal.

Preferably, the data mode decision circuit at least includes a digital-to-analog converter, a level shifter and an inversion circuit; the digital-to-analog converter is connected to the output terminal of the serial-to-parallel converter, and is used for converting the parallel data into an analog initial control signal; the level shifter is connected to an output terminal of the digital-to-analog converter, and is used for shifting a level of the analog initial control signal and then outputting the inversion control signal to the inversion circuit; the inversion circuit has an input terminal connected to the output terminal of the serial-to-parallel converter, the inversion circuit applying the inversion processing to the parallel data and then outputting the inverted parallel data to the flash memory chip under the control of the inversion control signal.

Preferably, the inversion circuit at least includes an inverter and a multiplexer; the multiplexer has two input terminals, one of which being directly connected to the output terminal of the serial-to-parallel converter, the other of which being connected to the output terminal of the serial-to-parallel converter via the inverter; the multiplexer outputs the inverted parallel data to the flash memory chip according to the inversion control signal outputted by the level shifter.

Compared to the prior art, the flash memory of the present invention converts the serial data received to a parallel data with the serial-to-parallel converter, and uses the data mode decision circuit to generate an inversion control signal for applying an inversion control to the parallel data, so as to, under the control of the inversion control signal, apply an inversion processing to the parallel data and output the inverted parallel data to the flash memory chip, in this way improving the programming efficiency and reducing the programming currents. In addition, compared to a flash memory adopting the bit inversion technique of the prior art, the flash memory of the present invention achieves a lower proportion of the inversion control signal to the total amount of data when maintaining the same programming efficiency and average programming power, which leads to a less area consumption of the flash memory of the present invention.

BRIEF DESCRIPTION OF THE DRAWINGS

The present invention will be further described and specified by using figures and implementation details as follows.

DETAILED DESCRIPTION

Embodiments of the present invention will be described and specified by using specific examples and figures in follows, and those skilled in the art can easily understand other advantages and beneficial effects of this invention from contents of this specification. The present invention can also be implemented or applied in other specific examples, and details of this specification based on other views and applications can be made to various modifications and variations without departing from the spirit or scope of the invention.

Figure 1:
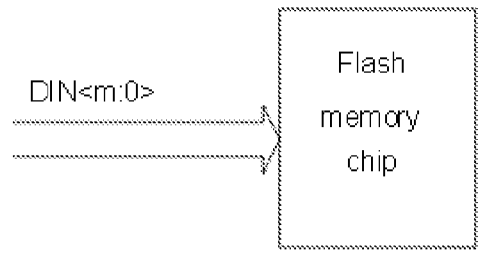
FIG. 1 illustrates the structure of a flash memory of the prior art.
Figure 2:
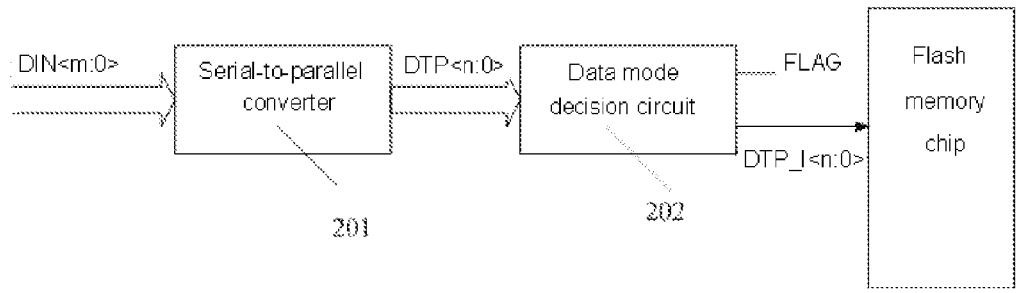
FIG. 2 illustrates the structure of the flash memory of the present invention.

FIG. 2 illustrates the structure of the flash memory of the present invention. As shown in FIG. 2, in addition to a flash memory chip, the flash memory of the present invention further includes a serial-to-parallel converter 201 and a data mode decision circuit 202.

The serial-to-parallel converter 201 is used for receiving a serial data DIN<m:0> and converting the serial data to a parallel data DTP<n:0>, where m may be 4, 8 or 16 and n may be 8, 16, 32, 64 or a larger number. The data mode decision circuit 202 is connected to an output terminal of the serial-to-parallel converter 201 for receiving the parallel data and is for generating an inversion control signal FLAG through the parallel data. The data mode decision circuit applies an inversion processing to the parallel data DTP<n:0> and then outputs an inverted parallel data DTP_I<n:0> to the flash memory chip under the control of the inversion control signal FLAG. It is worth pointing out that, it is determined by the structure of the flash memory that, during programming there is always a state in which the writing operation is difficult to be achieved, or a relatively large current is needed to complete the writing operation. A common way to save the current is to first invert the data difficult to be written and then write the inverted data. Such inverted data can be correctly read out according to the corresponding programming mechanism. For this reason, compared to the serial input method, the inversion control signal FLAG in the present invention takes a much smaller proportion of chip area, thus leading to a less area consumption while realizing the inversion of common bits.

Figure 3:
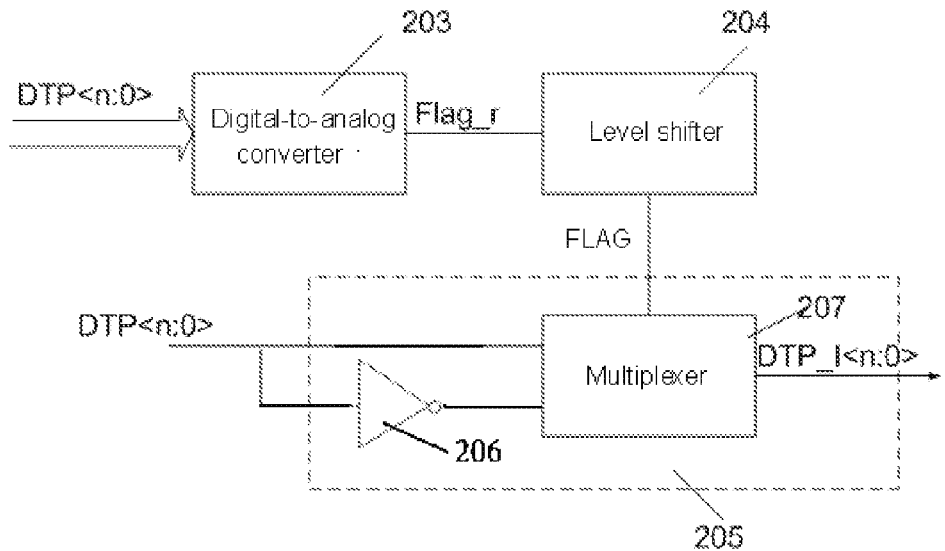
FIG. 3 is a circuit schematic view of the flash memory according to a preferred embodiment of the present invention.

FIG. 3 is a circuit schematic view of the flash memory according to a preferred embodiment of the present invention. More particularly, in the preferred embodiment of the present invention, the data mode decision circuit 202 at least includes: a digital-to-analog converter 203, a level shifter 204 and an inversion circuit 205. The digital-to-analog converter 203 is connected to the output terminal of the serial-to-parallel converter 201, and is used for converting the parallel data DTP<n:0> to an analog initial control signal Flag_r. The level shifter 204 is connected to an output terminal of the digital-to-analog converter 203, and is used for shifting the level of the analog initial control signal Flag_r and then outputting the inversion control signal FLAG. And the inversion circuit 205 has an input terminal connected to the output terminal of the serial-to-parallel converter 201. The inversion circuit 205 applies the inversion processing to the parallel data DTP<n:0> and then outputs the inverted parallel data DTP_I<n:0> to the flash memory chip under the control of the inversion control signal FLAG.

In the preferred embodiment of the present invention, the inversion circuit 205 at least includes an inverter 206 and a multiplexer 207. The multiplexer 207 is connected to an output terminal of the level shifter 204 and is controlled by the inversion control signal FLAG. The multiplexer 207 has two input terminals, one of which is directly connected to the output terminal of the serial-to-parallel converter 201, and the other of which is connected to the output terminal of the serial-to-parallel converter 201 via the inverter 206.

As described above, the flash memory of the present invention converts the serial data received to a parallel data with the serial-to-parallel converter, and uses the data mode decision circuit to generate an inversion control signal for applying an inversion control to the parallel data, so as to, under the control of the inversion control signal, apply an inversion processing to the parallel data and output the inverted parallel data to the flash memory chip, in this way improving the programming efficiency and reducing the programming currents. In addition, compared to a flash memory adopting the bit inversion technique of the prior art, the flash memory of the present invention achieves a lower proportion of the inversion control signal to the total amount of data when maintaining the same programming efficiency and average programming power, which leads to a less area consumption of the flash memory of the present invention.

The above embodiments are provided as examples for the purpose of describing the principle and effects of the invention and are not intended to limit the scope of the invention in any way. It will be apparent to those skilled in the art that various modifications and variations can be made without departing from the spirit or scope of the invention. Thus, it is intended that the present invention covers the modifications and variations of this invention provided they fall within the scope of the following claims and their equivalents.

What is claimed is:

1. A flash memory, comprising:
   a flash memory chip;
   a serial-to-parallel converter for receiving a serial data and converting the serial data into a parallel data; and
   a data mode decision circuit connected to an output terminal of the serial-to-parallel converter for receiving the parallel data and generating an inversion control signal, the data mode decision circuit applying an inversion processing to the parallel data and then outputting an inverted parallel data to the flash memory chip under control of the inversion control signal;
   wherein the data mode decision circuit at least comprises a digital-to-analog converter, a level shifter and an inversion circuit; the digital-to-analog converter is connected to the output terminal of the serial-to-parallel converter, and is used for converting the parallel data into an analog initial control signal; the level shifter is connected to an output terminal of the digital-to-analog converter, and is used for shifting a level of the analog initial control signal and then outputting the inversion control signal to the inversion circuit; the inversion circuit has an input terminal connected to the output terminal of the serial-to-parallel converter, the inversion circuit applying the inversion processing to the parallel data and then outputting the inverted parallel data to the flash memory chip under the control of the inversion control signal.

2. The flash memory according to claim 1, wherein the inversion circuit at least comprises an inverter and a multiplexer; the multiplexer has two input terminals, one of which being directly connected to the output terminal of the serial-to-parallel converter, the other of which being connected to the output terminal of the serial-to-parallel converter via the inverter; the multiplexer outputs the inverted parallel data to the flash memory chip according to the inversion control signal outputted by the level shifter.

* * * * *